United States Patent
Branham

(10) Patent No.: US 6,744,182 B2
(45) Date of Patent: Jun. 1, 2004

(54) PIEZOELECTRIC QUARTZ PLATE AND METHOD OF CUTTING SAME

(76) Inventor: Mark Branham, 3657 Genista Pl., Fallbrook, CA (US) 92028

( * ) Notice: Subject to any disclaimer, the term of this patent is extended or adjusted under 35 U.S.C. 154(b) by 0 days.

(21) Appl. No.: 10/201,521

(22) Filed: Jul. 23, 2002

(65) Prior Publication Data

US 2003/0042823 A1 Mar. 6, 2003

Related U.S. Application Data

(63) Continuation-in-part of application No. 09/866,262, filed on May 25, 2001, now abandoned.

(51) Int. Cl.⁷ .................. H02N 2/00; H01L 41/04
(52) U.S. Cl. .................. 310/361; 310/313 A; 310/360
(58) Field of Search .................. 310/361, 313 A, 310/370, 351, 360

(56) References Cited

U.S. PATENT DOCUMENTS

| | | | |
|---|---|---|---|
| 1,414,370 A | 5/1922 | Nicholson | |
| 2,173,589 A | 9/1939 | Mason et al. | |
| 2,212,845 A | 8/1940 | Nicolson | |
| 2,824,219 A | 2/1958 | Fisher et al. | |
| 4,079,280 A | 3/1978 | Kusters et al. | |
| 4,126,802 A | 11/1978 | Hermann | |
| 4,313,071 A | 1/1982 | Hermann et al. | |
| 4,375,604 A | 3/1983 | Vig | |
| 4,419,600 A | 12/1983 | Sinha | |
| 4,451,755 A | 5/1984 | Vig et al. | |
| 4,499,395 A | 2/1985 | Kahan | |
| 4,503,353 A | 3/1985 | Hermann | |
| 4,602,182 A | 7/1986 | Webster | |
| 4,670,681 A | 6/1987 | Wright | |
| 4,701,661 A | 10/1987 | Warner et al. | |
| 4,924,132 A | * 5/1990 | Ziegler | 310/361 |
| 5,001,383 A | 3/1991 | Kawashima | |
| 5,012,151 A | 4/1991 | EerNisse et al. | |
| 5,221,873 A | 6/1993 | Totty et al. | |
| 5,311,096 A | 5/1994 | Kawashima | |
| 5,334,900 A | 8/1994 | Kawashima | |
| 5,530,408 A | 6/1996 | Vig et al. | |
| 6,111,340 A | 8/2000 | Sinha et al. | |
| 6,114,801 A | 9/2000 | Tanaka et al. | |
| 6,172,443 B1 | 1/2001 | Branham | |
| 6,316,861 B1 | * 11/2001 | Ballandras et al. | 310/313 A |

* cited by examiner

Primary Examiner—Michael C. Zarroli
(74) Attorney, Agent, or Firm—Simpson & Simpson, PLLC

(57) ABSTRACT

A piezoelectric quartz plate having reduced frequency deviation as a function of temperature, wherein the quartz plate is cut at an angle described by:

$$T_f = 3.9 + 6.5\cos^2\theta + \frac{1}{2}\left[\frac{c_{66}T_{c_{66}}\sin^2\theta + c_{44}T_{c_{44}}\cos^2\theta + T_{c_{14}}c_{14}\sin 2\theta}{c_{66}\sin^2\theta + c_{44}\cos^2\theta + c_{14}\sin 2\theta}\right] +$$
$$[a' \cdot (\sin(\omega \cdot \theta + \phi') + (\sin(\omega \cdot \theta + \phi'))^2)] + \delta$$

where quartz plate thickness is chosen in accordance with a desired frequency. This useful behavior can be manipulated such that a quartz plate is designed to counteract frequency shifts over temperature excursion of other electrical components found in typical oscillator circuits. The choice of angles of cut having larger margins of error means that quartz oscillators can be more easily reproduced on a large scale and at a lower cost than has traditionally been the case.

13 Claims, 6 Drawing Sheets

PIEZOELECTRIC QUARTZ PLATE AND METHOD OF CUTTING SAME

CROSS REFERENCE TO RELATED APPLICATIONS

This Continuation-in-Part Patent Application claims benefit under 35 U.S.C. §120 of U.S. patent application Ser. No. 09/866,262 now abandoned, which was filed on May 25, 2001.

FIELD OF THE INVENTION

The present invention relates to the field of quartz plate oscillators, and, more specifically, to a method for determining angles of cuts that produce quartz plates having low shifts in frequency as a function of temperature, and the manipulation of that method to reduce the effects of other electrical components.

BACKGROUND OF THE INVENTION

In 1980 the Curie brothers observed that when a permanently polarized material is subjected to a mechanical force an electric field is produced. Today, this phenomenon is referred to as the piezoelectric effect. Conversely, when an alternating electric current is applied to opposite faces of a piezoelectric crystal, the crystal expands and contracts in concert with the alternating electric current. Piezoelectric crystals typically resonate within narrowly defined frequency ranges and when suitably mounted they can be used in electric circuits as components of highly selective filters or as frequency-control devices for very stable oscillators.

As demand for space on the available radio-frequency spectrum grows, spacing between assigned frequencies has become tighter. To avoid interference between transmitters operating in the same geographical area or on adjacent channels, it is essential that frequency be accurately controlled.

The internal constraints of communication devices also demand small frequency deviation as a function of temperature, and as consumer demand continually drives down the size and the cost of this equipment, the need for smaller piezoelectric devices that can maintain tight temperature performance and that are less costly to manufacture becomes increasingly greater.

Due to its high Q value (a measure of the properties that give the quartz crystal its unique ability to control a frequency) and its low cost, quartz ($SiO_2$) is the material of choice for the production of piezoelectric devices. Quartz plates are commonly used for frequency control in electronic devices such as computers, cellular phones, pagers, radios, and wireless data devices, and have been exploited to produce very accurate clocks.

Originally, quartz plates were made from natural quartz crystals, but today quartz plates are cut almost exclusively from synthetically produced quartz crystals. The orientation, or angle, of the cut with respect to the crystallographic axes X, Y, and Z (FIG. 1) determines how the oscillation frequency of the plate will be affected by temperature variations where temperature dependence is often expressed in terms of the temperature coefficient of frequency and by other properties of the resonator. In addition, the angle of cut determines the tolerance level, or margin of error, for a given cut. In mass production a low margin of error results in substantial increases in manufacturing costs and in the additional cost of providing corrections for errors made.

The X, Y, and Z crystallographic axis are often referred to as the electrical, mechanical, and optic axes, respectively.

The earliest quartz crystal cut was made with the crystal's major face perpendicular to the X-axis and with its length along the Y-axis. Whenever a cut is made so that the major face of the crystal plate is perpendicular to a particular axis, that cut is given the name of the axis to which it is perpendicular (FIG. 2). For example, when a cut in made so that the crystal's major face is perpendicular to the X-axis, it is referred to as an X cut.

To eliminate the coupling effect that is inherent in X cuts, the angle of the X cut can be rotated 18.5° from the Y-axis toward the Z axis (FIG. 3). The rotated X cut gives a good resonance free from other modes. It suffers, though, from the fact that, to get a reasonably high frequency from this type of length vibrating cut, too small a length to be practical is required.

Eventually a Y cut (a cut where the large crystal face is perpendicular to the Y axis) was developed. This cut, however, suffers from large changes in frequency with changes in temperature, i.e., the frequency increases about 86 ppm (parts per million) for each degree Centigrade increase in temperature. To reduce the temperature effect, the angles at which the Y cuts are made can be varied. When cuts are made at angles of either +35° 15' or −49° (rotated about the X axis) the first order, or linear portion, of the temperature coefficient of frequency is zero. A quartz plate cut at a +35° 15' angle is referred to as an AT cut plate and a plate cut at a −49° angle is referred to as a BT cut plate (FIG. 4).

The conventional mathematical description of quartz's piezoelectric behavior as a function of temperature dates back to the early WWII efforts and is based on several simplifying mathematical assumptions. These simplifying assumptions (i.e., ignoring many of the properties that control the piezoelectric behavior of quartz) enable easy, though not definitive, calculation of the temperature coefficients of various cuts of quartz plates. For example, the original mathematical description published by Heising in 1946 (Quartz Crystals for Electrical Circuits, Raymond A. Heising, D. Van Nostrand Co. Inc. 1946, pg. 27), and republished in a restated form later by Salt (Hy-Q Handbook of Quartz, David A. Salt, 1983), is based on the assumption that all piezoids of quartz are equivalent and that their stiffness coefficients repeat 0° to 90°, 90° to 180°, 180° to 270°, and 270° to 360°. It is also based on the assumption that the mechanical vibrations in the crystal are ideal and perfectly elastic.

These assumptions led to the published (Quartz Crystals for Electrical Circuits, Raymond A. Heising, D. Van Nostrand Co. Inc. 1946 pg. 54) and commonly accepted equation:

$$T_f = 3.9 + 6.5\cos^2\theta + \frac{1}{2}\left[\frac{c_{66}T_{c_{66}}\sin^2\theta + c_{44}T_{c_{44}}\cos^2\theta + T_{c_{14}}c_{14}\sin 2\theta}{c_{66}\sin^2\theta + c_{44}\cos^2\theta + c_{14}\sin 2\theta}\right] \quad (1)$$

where:
Tf=frequency temperature coefficient,
θ=angle of rotation from the Z axis,
$c_{xx}$=is the value of stiffness. The subscripts denote the stiffness of a given rhombohedral axis.

This equation uses the older IRE (Institute of Radio Engineers) convention of designating the "AT" cut as a positively rotated Y cut. Subsequent publications by Bottom (Introduction to Quartz Crystal Design, Virgil Bottom, Van Nostrand Reinhold Co. 1982) and by Salt (Hy-Q Handbook of Quartz, David A. Salt, 1983) updated the formulation to use the more modern sign convention that produces the familiar curve giving the relationship of temperature coefficient to angle of cut (FIG. 5). This graph shows zero frequency temperature coefficient points for the first order approximation at the familiar AT and BT cut angles. The commercial success of the AT cut in comparison to the BT cut lies in the fact that for the AT cut not only is the first order temperature coefficient zero but its second order temperature coefficient is also zero. This condition gives the AT cut a much lower total frequency deviation as a function of temperature compared to the BT cut.

The AT cut provides a low cost quartz plate with good frequency-temperature performance. The AT cut, although widely used, does not perform well when mechanically and thermally stressed. This shortcoming can be reduced by using a doubly rotated cut. A doubly rotated cut is obtained by starting with a traditionally rotated Y cut, with its initial rotation about the X axis through an angle θ, followed by a second rotation about the new Z axis (referred to as Z' and is defined by the crystallographic axes of the rotated plate) through an angle φ. Thus, a doubly rotated cut is defined by the angles φ and θ, where in the case of an AT cut the φ is zero.

A third rotation, referred to as an in-plane omega rotation, is sometimes used to separate unwanted vibrational modes from the main mode. An omega rotation is made in the plane of either a singly or a doubly rotated cut. For example, after a plate is oriented by a rotation oft theta equal to 44 degrees and another with phi equal to 12 degrees, the plate is then rotated within the plane so that the length of the plate is not exactly along either the x or z axis, but resides somewhere between the x and z axes.

These improvements none withstanding, the modem trend is for tighter and tighter frequency-temperature performance from piezoelectric resonators. This requirement has resulted in the use of external temperature compensation schemes being applied to systems utilizing AT-cut quartz resonators, which increases cost, time, and system complexity. There are other angles of cut, but they all suffer from either strong frequency dependence on temperature or on the presence of competing modes of vibrations.

It is clear then that there exits a need for additional angles of cut that will reduce the frequency dependence on temperature and on the presence of other modes of vibrations. It is also clear that there is a need for a way to determine, without undue experimentation, which angles of cut will produce desired results.

SUMMARY OF THE INVENTION

The present invention generally provides for piezoelectric quartz plates having reduced frequency deviation as a function of temperature, wherein the quartz plates are cut at an angle described by:

$$T_f = \\ 3.9 + 6.5\cos^2\theta + \frac{1}{2}\left[\frac{c_{66}T_{c_{66}}\sin^2\theta + c_{44}T_{c_{44}}\cos^2\theta + T_{c_{14}}c_{14}\sin2\theta}{c_{66}\sin^2\theta + c_{44}\cos^2\theta + c_{14}\sin2\theta}\right] + \\ [a' \cdot (\sin(\omega \cdot \theta + \phi') + \sin(\omega \cdot \theta + \phi')^2)] + \delta \quad [2]$$

where $T_f$=frequency temperature coefficient,

θ=angle of rotation from the Z axis, $c_{xx}$=is the value of stiffness. The subscripts denote the stiffness of a given rhombohedral axis, ω=the angular velocity of the wave traversing the crystal face, a'=the amplitude of the wave traversing the crystal face, φ'=the phase delay imposed on the wave traversing the crystal face due to resistance by its surroundings, and δ=offset value between the idealized wave and the wave with a damping function.

Accordingly, a primary object of the present invention is to provide quartz plates having reduced vibrational frequency dependence on temperature and on other modes of vibrations that are present, where the quartz plates are for use in electric circuits as components of highly selective filters or as frequency-control devices for very stable oscillators, such as is required by computers, cellular phones, pagers, radios, and wireless data devices, and very accurate clocks.

A secondary object of the present invention is to provide for a method to determine angles of cut for the cutting of quartz plates wherein quartz plates having reduced frequency dependence on temperature and on other modes of vibrations present are produced.

A further object of the present invention is to provide for a method to determine angles of cut for the cutting of quartz plates wherein quartz plates having a desired margin of error are produced.

Another object of the present invention is to provide for a method to determine angles of cut for the cutting of quartz plates from quartz crystals wherein quartz plates having properties that will correct effects from other electronic components present.

These and other objects, features, and advantages of the present invention will become apparent upon a reading of the detailed description and claims in view of the several drawing figures.

DETAILED DESCRIPTION OF THE PREFERRED EMBODIMENT

Figure 1:
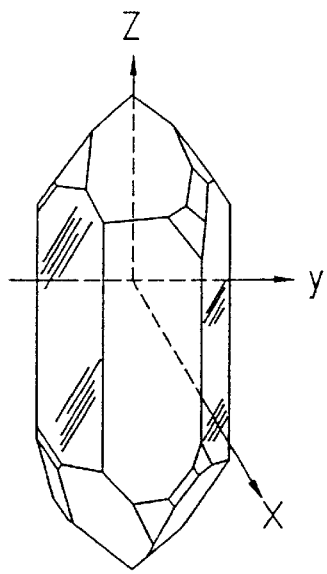
FIG. 1 shows a quartz crystal and the relationship of the crystal faces to the X, Y, and Z axis of an orthogonal coordinate system.
Figure 2:
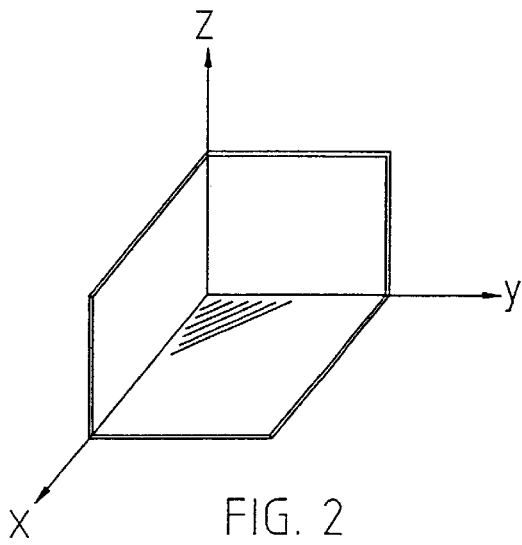
FIG. 2 shows the orientation of conventional X cut, Y cut, and Z cut planes relative to the to the X, Y, and Z crystallographic axes shown in FIG. 1.
Figure 3:
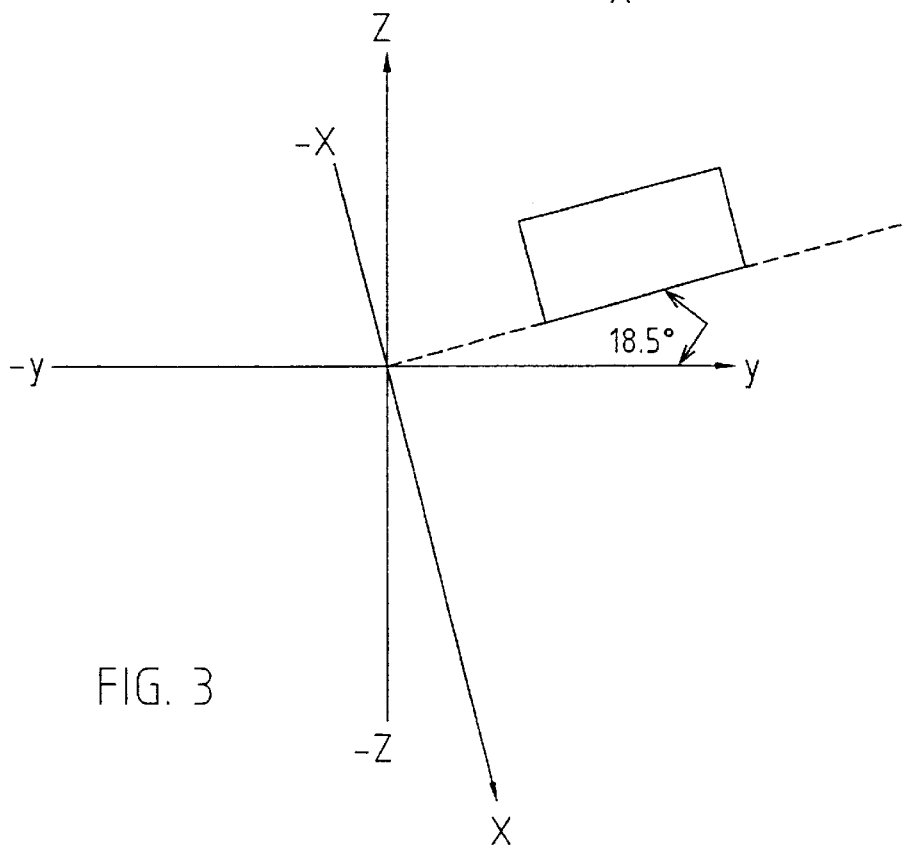
FIG. 3 depicts an X cut quartz plate rotated 18.5° from the Y axis toward the Z axis.
Figure 4:
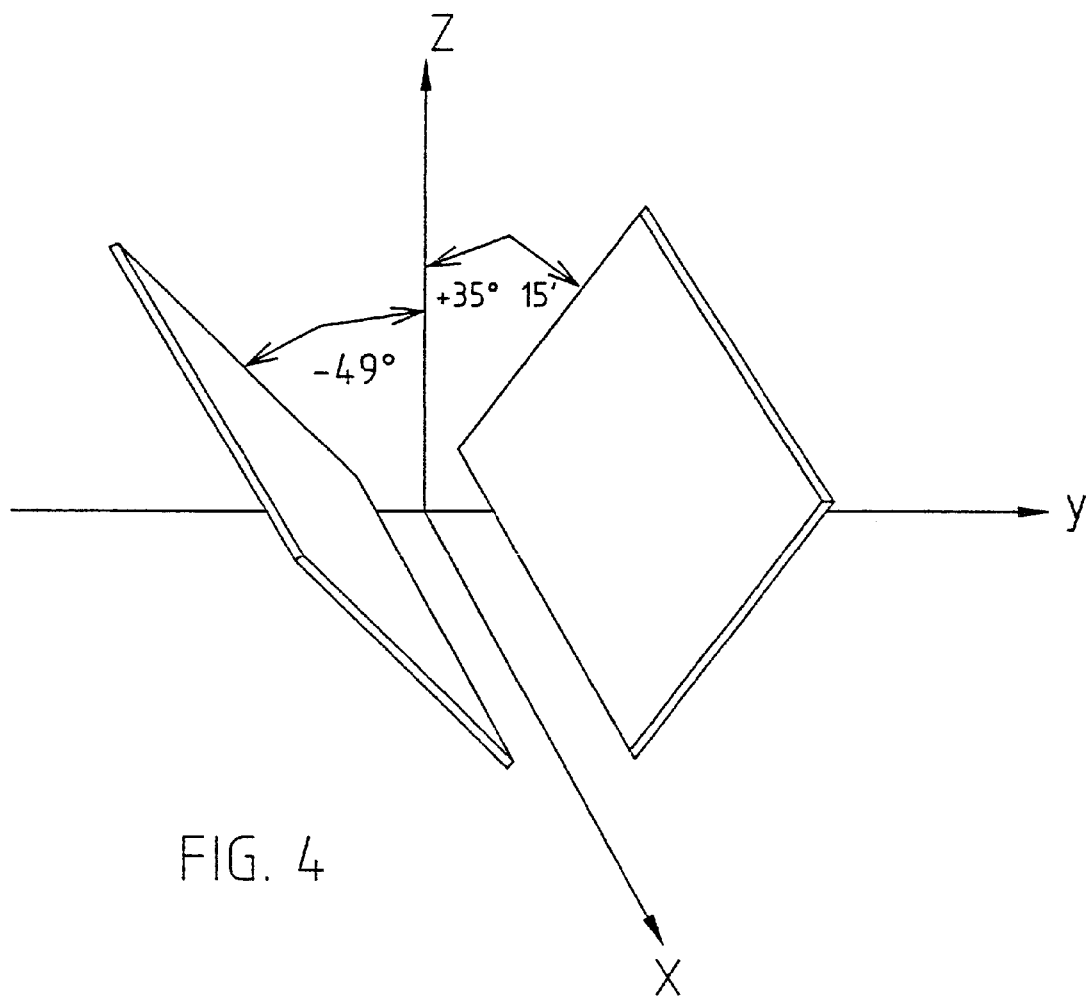
FIG. 4 depicts two Y cut quartz plates, one rotated about the X axis in a negative direction and one rotated about the X axis in a positive direction relative to the Z axis.

This invention relates to, and claims, quartz crystals (as articles of manufacture) cut at specific calculated angles to the method that is used to select specific angles of cut to obtain quartz plates having desired properties. Control devices in radios, cellular telephony, and other modem communications devices demand that shifts in frequency caused by temperature fluctuations be kept to a minimum. One advantage of the new cut angles of the present invention stems from the fact that quartz crystals manufactured according to the present invention exhibit low shifts in natural frequency of resonance as a function of changes in temperature. This invention also describes and claims a method that allows the manufacture of quartz plates that counteract frequency shifts over temperature excursion caused by other electrical components that make up typical oscillator circuits. In addition, this invention enables and claims angles of cut selected for a desired margin of error, which provides for large scale manufacture of quartz plates with greater reproducibility and at lower cost than has traditionally been the case.

At the outset, it should be clearly understood that like reference numerals used in the related drawings are intended to identify the same structural elements, portions, or surfaces consistently throughout the several drawing figures, as may be further described or explained by the entire written specification of which this detailed description is an integral part. The to drawings are intended to be read together with the specification, and are to be construed as a portion of the entire "written description" of this invention, as required by 35 U.S.C. §112.

For purposes of this patent, the terms appearing in the description and in the claims are intended to have the following meanings:

"Q value" as used here is a measure of the activity of a crystal relative to the amount of activity (grid current) that is produced in an electrical oscillator circuit.

$\omega$=the angular velocity of the wave traversing the crystal face.

a'=the amplitude of the wave traversing the crystal face.

$\phi$'=the phase delay imposed on the wave traversing the crystal face due to resistance by its surroundings.

$\delta$=offset value between the idealized wave and the wave with a damping function $f_{sum}(\theta)/y(\theta)$=sum of the idealized wave and the damping function.

As used herein, the angle theta ($\theta$) refers to an angle of rotation from the Z axis and about the X axis such that axes X, Y' and Z' are formed. The angle phi ($\phi$) refers to an angle of rotation about the Z' axis, or in the case where theta $\theta$ is 0°, a rotation about the Z axis.

The first step in improving the existing approximations (see Eq. 1) is to address the area of idealized perfectly elastic oscillations. If the idealized case were true, it should be possible to add electrical energy to a quartz crystal causing it to vibrate, and ideally, the crystal should vibrate essentially forever without additional energy input. This is much like the mechanical analogy where a mass attached to a spring is pulled by grasping the mass and stretching the spring, pulling the mass in a direction away from the spring, to add energy to the system and then releasing the mass. In the ideal case the mass will oscillate forever, as in the ideal case no energy is lost in the compression or extension of the spring and there would be no loss of energy to the surroundings.

In the case of a vibrating quartz plate, the Q value of quartz is very high, therefore it behaves as a very efficient spring having a very high stiffness, thus minimizing losses due to inelastic motion. Being finite, losses do occur, but they are a small fraction of the actual energy lost. In the case of quartz, the rate of vibration is high compared to a mechanical spring analog, and so much of the energy is lost as velocity squared proportional damping. This effect, commonly called "wind resistance" is found to be important in any projectile or other type motions as the speed of motion increases. In the case of modem quartz chips that are vibrating at frequencies of many megahertz, wind resistance becomes the dominant loss term even though the amplitude of the physical vibration is small and the total mass of atmosphere moved is also very small.

Figure 5:
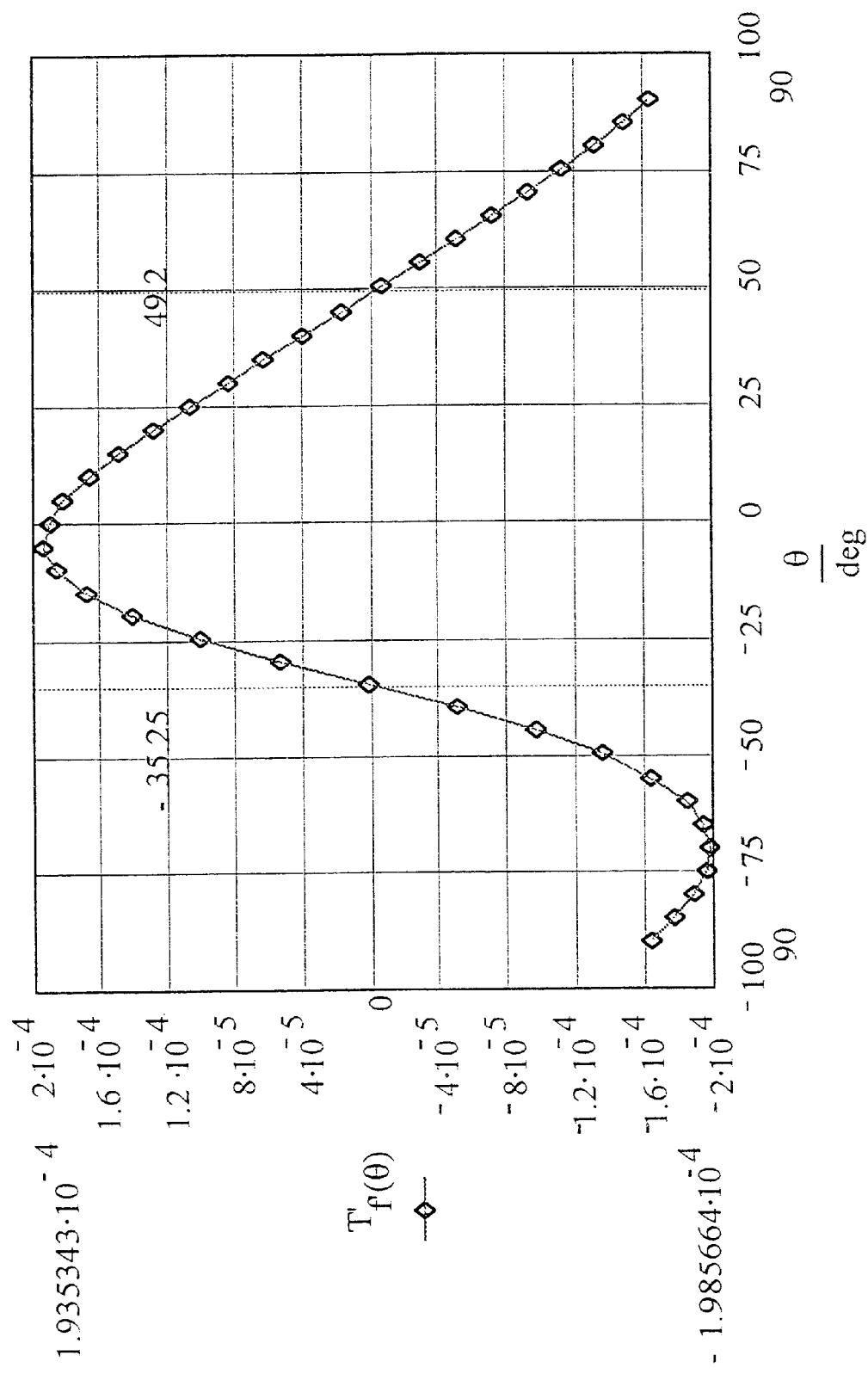
FIG. 5 is a graphical representation of the relationship of temperature coefficient to various angles of cut based on the currently accepted, unmodified, mathematical model. Also shown are the zero temperature coefficient points for the first order approximation at the familiar AT and BT cut angles.
Figure 6:
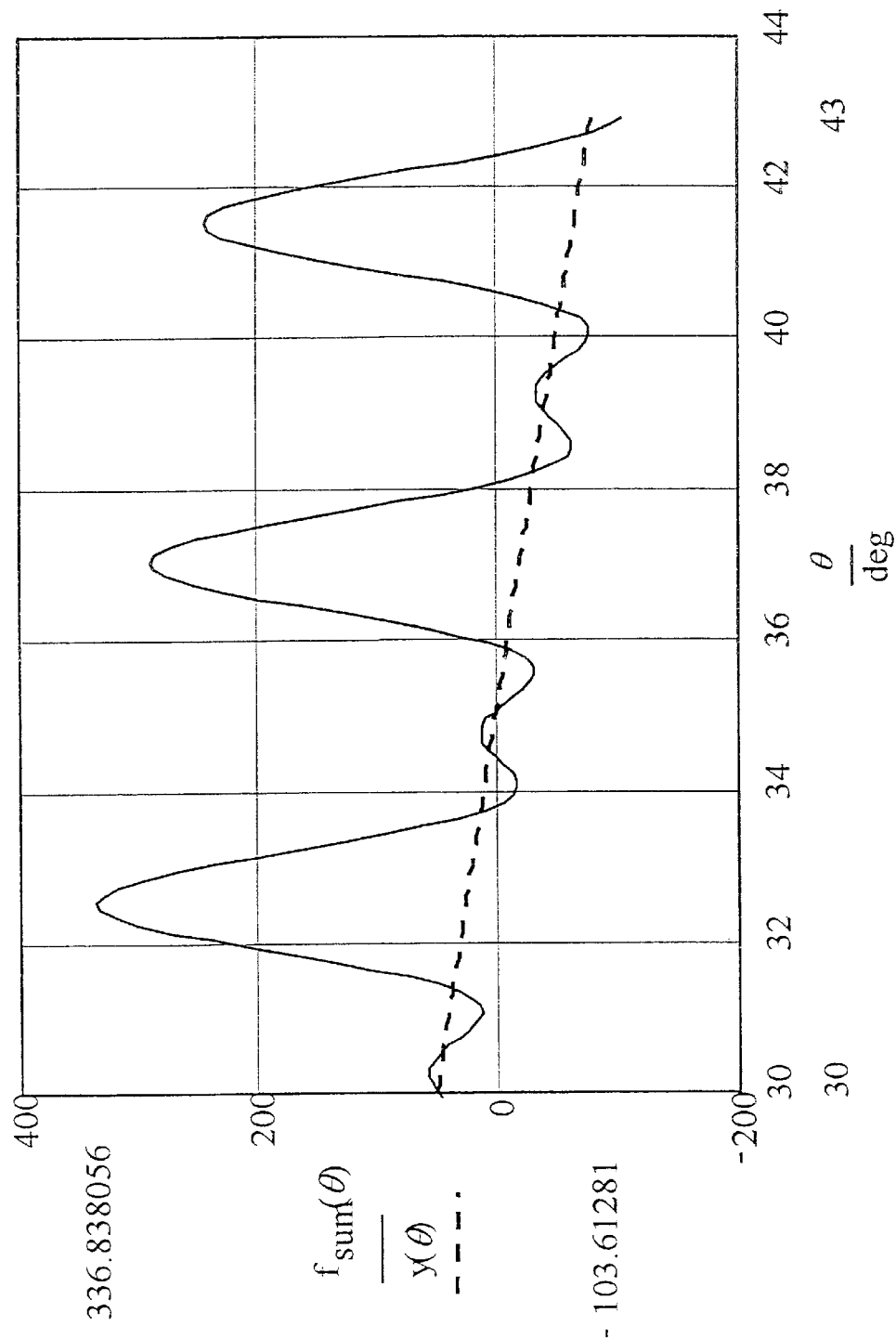
FIG. 6 shows short segments of the curve illustrated in FIG. 5 (dashed) and of the curve (solid) that is obtained by adding a damping term to the traditional mathematical formulation.

Adding a loss term (Eq. 3, which is a basic velocity proportional damping term) to the conventional equation (Eq. 1), where the magnitude of the loss term is proportional to the square of the wave velocity, produces a modified curve (FIG. 6) as compared to the curve (FIG. 5) that was produced using Eq. 1. The dashed line in FIG. 6 is a short segment of the prior graph (FIG. 5) and the solid line is the curve produced by adding the damping term to the traditional mathematical formulation. In this close up view, one can see that not only is the AT cut accounted for, but also the SC cut at 34.2°, the IT cut at 36°, the ST cut at 42.4° and the CT cut at 38.1°.

Additionally, we see not only that the ST cut is represented, but why ST cut quartz plates are so difficult to manufacture. As shown in FIG. 6, the ST cut angle resides on a very steep slope as compared to the AT and SC cut angles, so if the ST cut is missed by even a small margin, the resulting plates very quickly lose their first order zero temperature coefficient.

Figure 7:
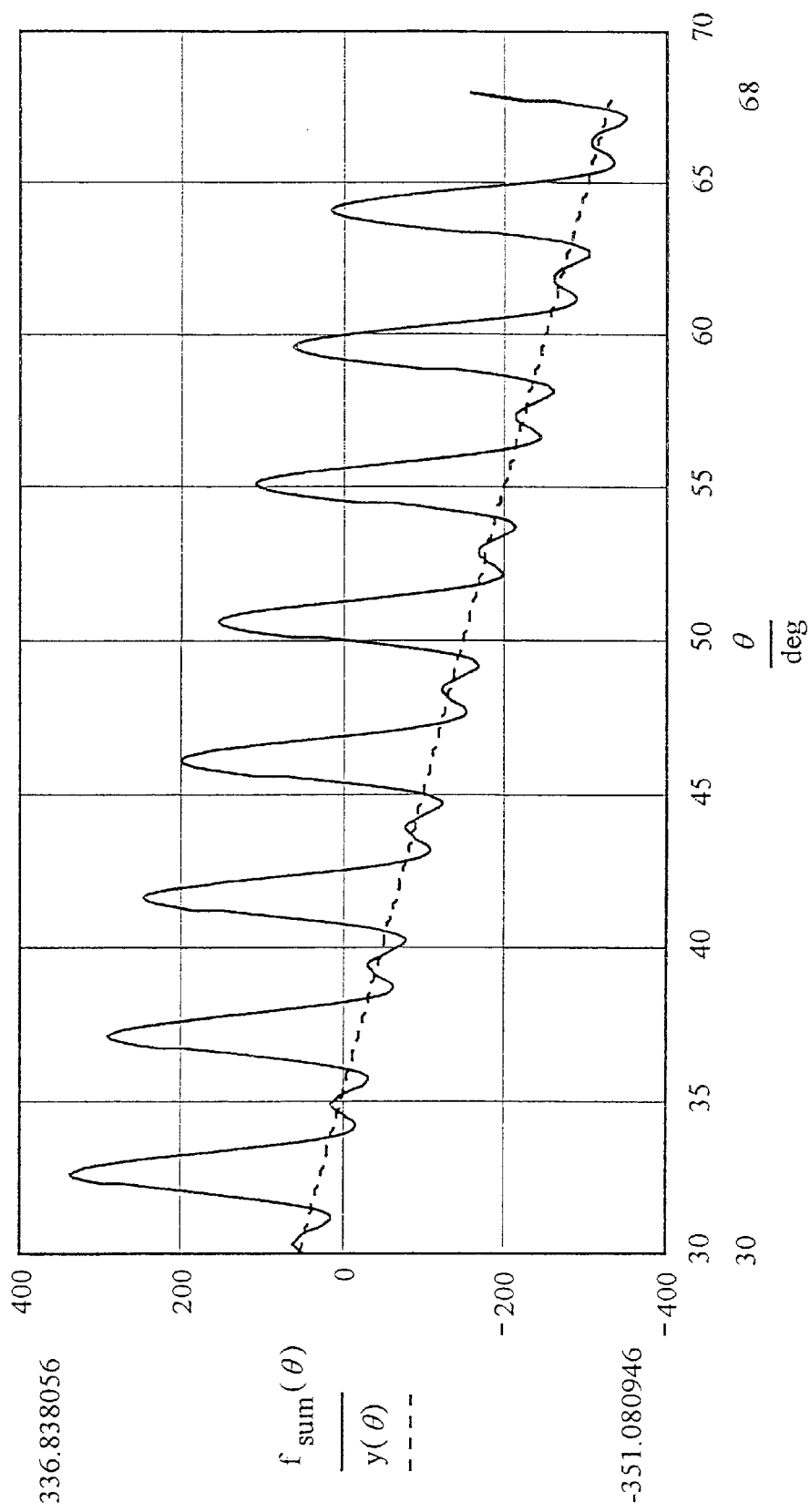
FIG. 7 is an expanded view of the modified traditional mathematical formulation.

In the expanded view of the curve (FIG. 7) produced using the modified traditional mathematical formulation (Eq. 2) more of the known cuts are also accounted for.

The loss term added to the traditional first order approximation of the variation of temperature coefficient with temperature (Eq. 1), has the form:

$$[a'\cdot(\sin(\omega\cdot\theta+\phi')+\sin(\omega\cdot\theta+\phi')^2)]+\delta \qquad (3)$$

Where there are typical values such as;

$\omega$=80 a'=15

$\phi$'=1.5 deg $\delta$=10

Equation 1 (as given in the Background section), Equation 2 (as given in the Summary section), and Equation 3 are periodic functions, which means that it is possible to fit the actual behavior of the quartz plate with a number of combinations involving multiples of the frequency term $\omega$ with differing values of the other variables. These particular values are used as a close approximation of the description of the actual physical behavior of know cuts and to demonstrate the mathematical form of the damping function.

Further refinements would increase the accuracy of the fit of the curve to the known cuts, but as a first order approximation, the addition of the basic velocity proportional damping term accounts for much more of the known quartz behavior than does the prior mathematical description alone.

Figure 8:
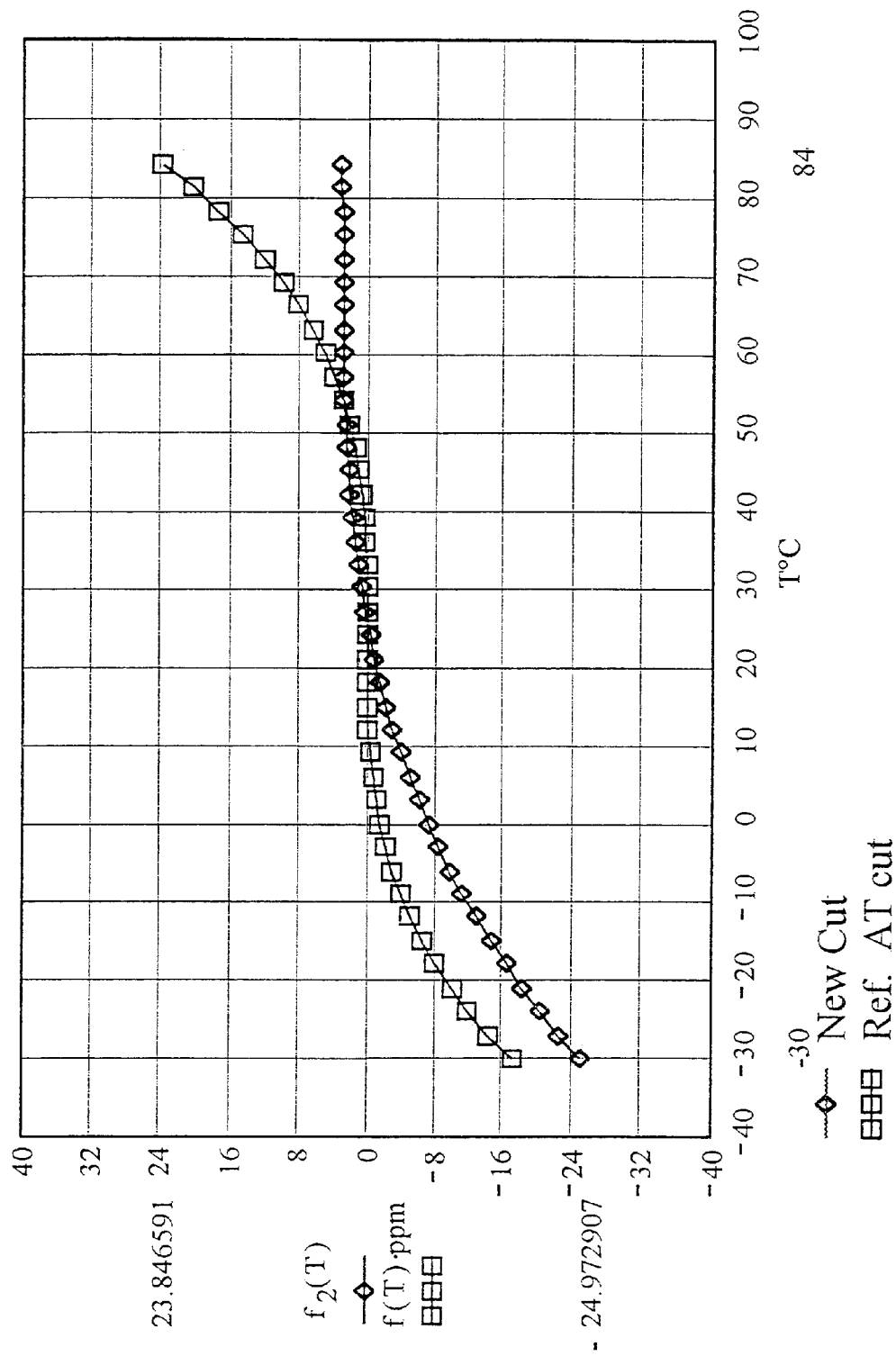
FIG. 8 illustrates the difference in frequency deviation with temperature between a reference AT cut quartz plate and a cut that was made close to the GT cut of 51° to test the model.

To test the model, a trial cut was made in the area close to the GT cut angle of 51°. The concept being that an ideal commercial cut would have a lower third order coefficient similar to the GT cut, but unlike a plate made using a GT cut where the edges of the blank are vibrating and the center is not vibrating, an ideal commercial cut would vibrate in a shear like mode such that the edges of the quartz plate do not vibrate like the familiar AT cut. This would facilitate manufacturability, a key obstacle to the adoption of the GT cut despite its technical advantage of a low frequency deviation over an exceptionally wide temperature range. Test cuts in the range of interest produced the results illustrated in FIG. 8.

This experiment shows that reduced frequency deviation can be obtained over a wide temperature range as compared to the industry standard AT cut. This reduction in frequency deviation allows the quartz plate to perform temperature compensation functions that are currently required in modern designs. The elimination of these compensation electronics reduces both electronics cost and complexity. Conversely, applying the compensation electronics to the new crystal cut would achieve tighter frequency control in a given application.

A review of related literature underscores that the currently accepted mathematical interpretation predicts two first order zero temperature coefficient quartz cut angles. When, in actual fact, by experimental practice, more than a dozen first order zero temperature coefficient cuts are known to exist. The discrepancy between the cuts known to exist and the lack of a predictive mathematical structure has lead to the more complete description and mathematical model of this invention. The improved model of this invention allows for faster exploration of potentially commercially successful cut angles and development of those candidate cuts into operating devices. It should be remembered that to uncover the actual behavior of quartz without benefit of the more accurate model of the present invention would entail making trial cuts on both the theta and phi crystal axes in mutual increments of no more than a few minutes of arc. The small step size of the trials is due to the very high rate of change of the temperature coefficient as a function of cut angle. Much like the "needle in a haystack" analogy, random or widely spaced trial cuts are unlikely to produce successful results. The level of difficulty of discovery of new cuts by experimental trail and error using the conventional mathematical approach as indicated by this analysis is borne out by the fact that the last commercially successful quartz cut, the "SC" cut, was patented over twenty two years ago despite the support of a burgeoning electronics industry and the large worldwide demand spurred by the computer, fax and cellular telephony industries.

Thus, it is seen that the objects of the invention are efficiently obtained. It should be appreciated, however, that the invention is not directed solely to the particular embodiment described herein, but is capable of various modifications, rearrangements, and substitutions should be readily apparent to those having ordinary skill in the art without departing from the scope of the invention.

The foregoing detailed description is an explanation of the preferred embodiment of the present invention, as well as the best mode presently known to the inventor. However, the scope of the invention is not to be limited by the description of the preferred embodiment but rather is defined by the scope of the claims, following which are appended hereto and are hereby included in and made part of this specification by this reference.

What I claim is:

1. A piezoelectric quartz plate having reduced frequency deviation as a function of temperature, wherein said plate is cut at an angle described by:

$$T_f = 3.9 + 6.5\cos^2\theta + \frac{1}{2}\left[\frac{c_{66}T_{c_{66}}\sin^2\theta + c_{44}T_{c_{44}}\cos^2\theta + T_{c_{14}}c_{14}\sin2\theta}{c_{66}\sin^2\theta + c_{44}\cos^2\theta + c_{14}\sin2\theta}\right] + [a' \cdot (\sin(\omega \cdot \theta + \phi') + (\sin(\omega \cdot \theta + \phi'))^2)] + \delta$$

where $T_f$=frequency temperature coefficient, $\theta$=angle of rotation from the Z axis, $c_{xx}$=is the value of stiffness, the subscripts denote the stiffness of a given rhombohedral axis, $\omega$=the angular velocity of the wave traversing the crystal face, a'=the amplitude of the wave traversing the crystal face, $\phi'$=the phase delay imposed on the wave traversing the crystal face due to resistance by its surroundings, and $\delta$=offset value between the idealized wave and the wave with a damping function;

wherein the angle of cut is from −90 to 0.26 degrees, 0.26 to 29.74 degrees, 30.26 to 69.74 degrees and 70.26 to 90 degrees in phi.

2. The piezoelectric quartz plate of claim 1 wherein a plate thickness is chosen in accordance with a desired frequency.

3. The piezoelectric quartz plate of claim 1 wherein the angle of cut is from 44 to 50° in theta and from 0 to +/−90° in phi, whereby the frequency deviation as a function of temperature is improved compared to the industry standard AT cut.

4. The piezoelectric quartz plate of claim 1 wherein the angle of cut is from 52 to 66° in theta and from 0 to +/−90° in phi, whereby the frequency deviation as function of temperature is improved compared to the industry standard AT cut.

5. The piezoelectric quartz plate of claim 1 wherein the angle of cut is from 66 to 67.9° and 72.1 to 74° in theta and from 0 to +/−90° in phi, whereby the frequency deviation as function of temperature is improved compared to the industry standard AT cut.

6. A piezoelectric quartz plate having axes X, Y, and Z and angles of cut phi and theta such that the axes X', Y' and Z' are established from the crystallographic X, Y, and Z axes of the quartz crystal by means of a first rotation through an angle theta from the axis Z, and a second rotation through an angle phi about the axis Z', said plate vibrating in accordance with the fundamental mode, the angles phi and theta being selected so that the first-order temperature coefficient is substantially zero, and the angles of cut phi and theta being defined by:

$$T_f = 3.9 + 6.5\cos^2\theta + \frac{1}{2}\left[\frac{c_{66}T_{c_{66}}\sin^2\theta + c_{44}T_{c_{44}}\cos^2\theta + T_{c_{14}}c_{14}\sin2\theta}{c_{66}\sin^2\theta + c_{44}\cos^2\theta + c_{14}\sin2\theta}\right] + [a' \cdot (\sin(\omega \cdot \theta + \phi') + (\sin(\omega \cdot \theta + \phi'))^2)] + \delta$$

where $T_f$=frequency temperature coefficient, $\theta$=angle of rotation from the Z axis, $c_{xx}$=is the value of stiffness, the subscripts denote the stiffness of a given rhombohedral axis, $\omega$=the angular velocity of the wave traversing the crystal face, a'=the amplitude of the wave traversing the crystal face, $\phi'$=the phase delay imposed on the wave traversing the crystal face due to resistance by its surroundings, and $\delta$=offset value between the idealized wave and the wave with a damping function, whereby frequency deviation based of the first order temperature coefficient as a function of temperature is substantially zero and wherein the angle of cut is from −90 to −0.26° and 0.26 to 90° in phi.

7. The piezoelectric quartz plate of claim 6 wherein a thickness of the quartz plate is chosen in accordance with a desired frequency.

8. The piezoelectric quartz plate of claim 6 wherein the angle of cut is from 44 to 50° in theta and from 0 to +/−90° in phi, whereby the frequency deviation as a function of temperature is improved compared to the industry standard AT cut.

9. The piezoelectric quartz plate of claim 6 wherein the angle of cut is from 52 to 66° in theta and from 0 to +/−90° in phi, whereby the frequency deviation as a function of temperature is improved compared to the industry standard AT cut.

10. The piezoelectric quartz plate of claim 6 wherein the angles of cut are from 66 to 67.9° and 72.1 to 74° in theta and from 0 to +/−90° in phi whereby the frequency deviation as function of temperature is improved compared to the industry standard AT cut.

11. The piezoelectric quartz plate of claim 6 having the angles phi and theta selected for a substantially zero second-order temperature coefficient.

12. The piezoelectric quartz plate of claim 11 having the angles phi and theta selected for a substantially zero third-order temperature coefficient.

13. The piezoelectric quartz plate of claim 6 wherein the angles phi and theta are selected so that the first order temperature coefficient is substantially zero, and the second and third order temperature coefficients are selected to be of equal magnitude and of opposite sign to the frequency shift over temperature excursions produced by other electrical oscillator components.

* * * * *